United States Patent
Harada

(10) Patent No.: US 7,485,933 B2
(45) Date of Patent: Feb. 3, 2009

(54) SEMICONDUCTOR INTEGRATED CIRCUIT DEVICE HAVING POLYCRYSTALLINE SILICON RESISTOR CIRCUIT

(75) Inventor: Hirofumi Harada, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 11/193,837

(22) Filed: Jul. 29, 2005

(65) Prior Publication Data

US 2006/0027894 A1 Feb. 9, 2006

(30) Foreign Application Priority Data

Aug. 4, 2004 (JP) ............................. 2004-228587

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. .................. 257/380; 257/359; 257/904

(58) Field of Classification Search .................. 257/359, 257/380, 385, 538, 904
See application file for complete search history.

(56) References Cited

U.S. PATENT DOCUMENTS 5,493,148 A * 2/1996 Ohata et al. .................. 257/538

FOREIGN PATENT DOCUMENTS

JP 406188371 * 7/1994

* cited by examiner

*Primary Examiner*—Monica Lewis
(74) *Attorney, Agent, or Firm*—Adams & Wilks

(57) ABSTRACT

A semiconductor device has a first insulating film formed on a semiconductor substrate and resistors disposed on the first insulating film. Each of the resistors is formed of a polycrystalline silicon film having a low concentration impurity region and high concentration impurity regions disposed on opposite sides of the low concentration impurity region. The low concentration impurity regions of the plurality of resistors have different lengths from one another. A second insulating film is disposed on the resistors. Contact holes are formed on the second insulating film and are disposed on the high concentration impurity regions. First metal wirings are connected to the respective contact holes and connect the resistors in series. A second metal wiring is connected to one of the resistors located at one end of the resistors connected in series. The second metal wiring covers the low concentration impurity region of all of the resistors.

6 Claims, 3 Drawing Sheets

Prior Art

SEMICONDUCTOR INTEGRATED CIRCUIT DEVICE HAVING POLYCRYSTALLINE SILICON RESISTOR CIRCUIT

BACKGROUND OF THE INVENTION

1. Field of the Invention

The present invention relates to a semiconductor integrated circuit including a resistor circuit made of polycrystalline silicon.

In a semiconductor integrated circuit, the following two resistors have been mainly used: a diffusion resistor, which is made of single crystalline silicon to which an impurity of an opposite conductivity to that of a semiconductor substrate is diffused, and a polycrystalline silicon resistor, which is made of polycrystalline silicon to which an impurity is diffused. Between the two, a polycrystalline silicon resistor has been widely used for a semiconductor integrated circuit because of its advantages, for example, that leak current is small since an insulating film surrounds the resistor, and that high resistance can be obtained owing to defects that exist at grain boundaries.

2. Description of the Related Art

FIGS. 2A and 2B show a conventional polycrystalline silicon resistor circuit. (For example, refer to JP 2002-76281 A.) FIG. 2A is a schematic plan view of the resistor circuit, and FIG. 2B is a sectional view which is taken along the line A-A' of FIG. 2A. The polycrystalline silicon resistor is formed by: implanting a p-type or N-type impurity to a polycrystalline silicon thin film deposited on an insulating film with an LPCVD method or the like; and processing the resultant into a resistor shape with a photolithography technique. Impurity implantation is carried out in order to determine the resistivity of the polycrystalline silicon resistor. Concentration of the P-type or N-type impurity ranges from $1 \times 10^{17}/cm^3$ to $1 \times 10^{20}/cm^3$ in accordance with the desired resistance.

Further, a contact hole and a metal wiring are disposed in each of terminals on both sides of a resistor to take out the potential thereof. To obtain a satisfactory ohmic contact between the polycrystalline silicon film and the metal wiring at the terminal, an impurity at a high concentration of $1 \times 10^{20}/cm^3$ or more is diffused into a part of the polycrystalline silicon film, which forms the resistor terminal.

In the case of structuring a resistor circuit shown in FIG. 3, the resistor using polycrystalline silicon is, therefore, formed of a polycrystalline silicon film 3 which is formed on an insulating film 2 on a semiconductor substrate 1 and which is composed of a low concentration impurity region 4 and high concentration impurity regions 5, as shown in the schematic plan view of FIG. 2A and the schematic sectional view of FIG. 2B. A potential of a terminal D (104) is taken out from a terminal A (101) through a metal wiring 7 via contact holes 6 formed in the second insulating film 9 and provided on the high concentration impurity regions 5.

Further, in FIG. 2A, between two metal wirings connected to the respective contact holes on both the sides of the resistor, one metal electrode is formed so as to cover the low concentration impurity region 4 in the polycrystalline silicon film 3. There are two reasons for the structure.

The first reason is to obtain stability of the polycrystalline silicon resistor. Since the polycrystalline silicon is a semiconductor, when a wiring or electrode is formed thereon, depletion or accumulation occurs in the polycrystalline silicon due to a relative relationship between the potential of the wiring or electrode and the potential of the polycrystalline silicon resistor, which varies a resistance value of the resistor. Specifically, as regards the polycrystalline silicon to which P-type impurity is diffused, the P-type polycrystalline silicon becomes depleted, which leads to a high resistance when the wiring or electrode having a higher potential than that of the polycrystalline silicon resistor exists immediately above the polycrystalline silicon. In the opposite potential relationship, the resistance lowers due to accumulation. In order to avoid such variation in resistance, a wiring having a potential close to that of the polycrystalline silicon is intentionally formed on the polycrystalline silicon, thereby keeping the constant resistance. One example of this is the plan view of FIG. 2A, where one of the electrodes of the polycrystalline silicon resistor is extended to the resistor to fix the potential.

The phenomenon described above naturally depends on not only the wiring above the polycrystalline silicon but also the state thereunder. That is, the resistance varies in accordance with the relative relationship in potential between the polycrystalline silicon resistor and a semiconductor substrate under the polycrystalline silicon resistor. A means for stabilizing the potential has been hence known in which a diffusion region or the like is intentionally formed under the polycrystalline silicon resistor in the same manner as the upper metal wiring although the diffusion region is not shown in the figure.

The second reason is to prevent hydrogen, which affects the polycrystalline silicon resistance, from diffusing to the polycrystalline silicon in a semiconductor manufacturing process. Polycrystalline silicon is composed of a grain with relatively high crystallinity and a grain boundary between grains having low crystallinity, that is, high trap levels. The resistance of a polycrystalline silicon resistor is almost determined by carriers, electrons or holes, which are trapped by a large number of levels that exist at the grain boundary. When hydrogen with a high diffusion coefficient is generated in the semiconductor manufacturing process, the generated hydrogen easily reaches the polycrystalline silicon resistor and is trapped by the level, which varies the resistance.

Examples of such hydrogen generating processes include a step of sintering in a hydrogen atmosphere after the metal electrode formation and a step of forming a plasma nitride film with the use of an ammonia gas.

Accordingly, in the resistor circuit as shown in FIGS. 2A and 2B, the variation in resistance of the polycrystalline silicon due to the above mentioned hydrogen diffusion can be suppressed by covering the polycrystalline silicon resistor with a metal wiring.

However, a method for stabilization of the polycrystalline silicon resistance of the above-described resistor circuit has the following problem. The problem is that: the metal wiring should be arranged to sufficiently cover the resistor in consideration for an alignment shift between the metal wiring and the polycrystalline silicon resistor and for preventing effect against the above-mentioned hydrogen diffusion when the metal electrode is disposed over the polycrystalline silicon resistor. As shown in FIG. 2A, a plurality of sets each including the polycrystalline silicon resistor and the metal wiring are arranged for resistors 201, 202, and 203. The area of the resistor circuit is not determined by a pitch/space of the polycrystalline silicon resistor but by a pitch/space of the metal wiring which covers the polycrystalline silicon resistor with a predetermined overlap amount and which has a larger processing dimension than that of the polycrystalline silicon resistor. This hinders the reduction in area of the resistor circuit.

SUMMARY OF THE INVENTION

The present invention has been made in view of the above, and has hence an object to provide a resistor circuit which is composed of polycrystalline silicon resistors each of which has little variation in resistance, which is stable, and which requires a small area.

To attain the above mentioned object, the present invention provides a resistor circuit including: a resistor circuit, comprising: a semiconductor substrate; a first insulating film formed on the semiconductor substrate; a plurality of resistors having the same shapes, each of which is formed on the first insulating film and is formed of a polycrystalline silicon film having a low concentration impurity region and high concentration impurity regions; a second insulating film formed on the plurality of resistors; contact holes formed on the second insulating film on the high concentration impurity regions; first metal wirings each of which is connected to each of the contact holes and which connects the plurality of resistors in series; and a second metal wiring connected to a resistor located at one end of the plurality of resistors connected in series, and covering the low concentration impurity region of each of the plurality of polycrystalline silicon resistors, wherein lengths of the low concentration impurity region and the high concentration impurity regions differ from one another among the plurality of polycrystalline silicon resistors.

Further, the present invention provides a resistor circuit, as regards the length of the low concentration impurity region in each of the polycrystalline silicon resistors is longest at an end of the plurality of resistors connected in series, shortest at the other end, and gradually becomes shorter from the end to the other end at a plurality of resistors therebetween.

According to the present invention, the resistor circuit can be provided which is composed of the polycrystalline silicon resistors each of which has little variation in resistance, which is stable, and which has high output voltage precision and a small area to implement.

DETAILED DESCRIPTION OF THE PREFERRED EMBODIMENTS

Hereinafter, description will be made of an embodiment of the present invention with reference to the drawings.

Figure 1A:
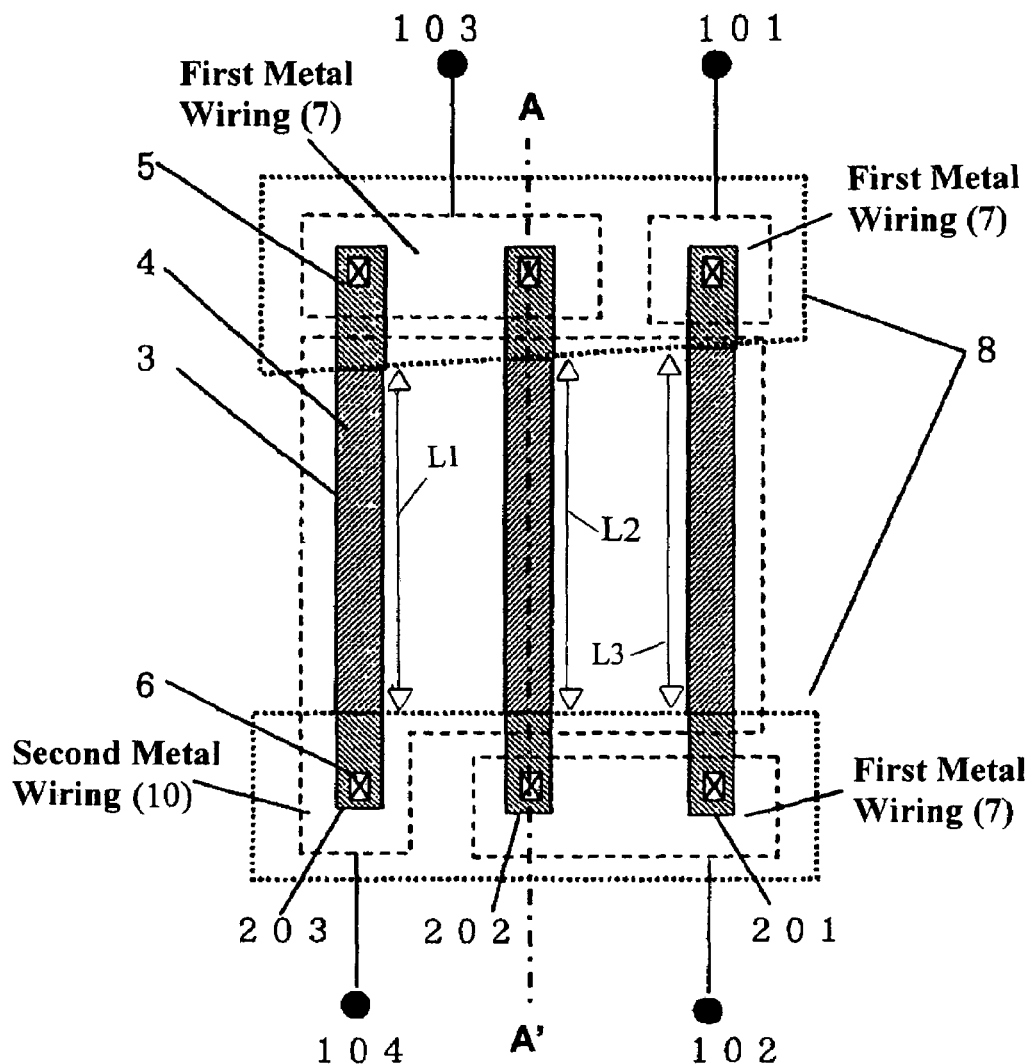
FIGS. 1A and 1B are a schematic plan view and a schematic sectional view taken along line A-A' in FIG. 1A of a polycrystalline silicon resistor circuit according to the present invention.
Figure 1B:
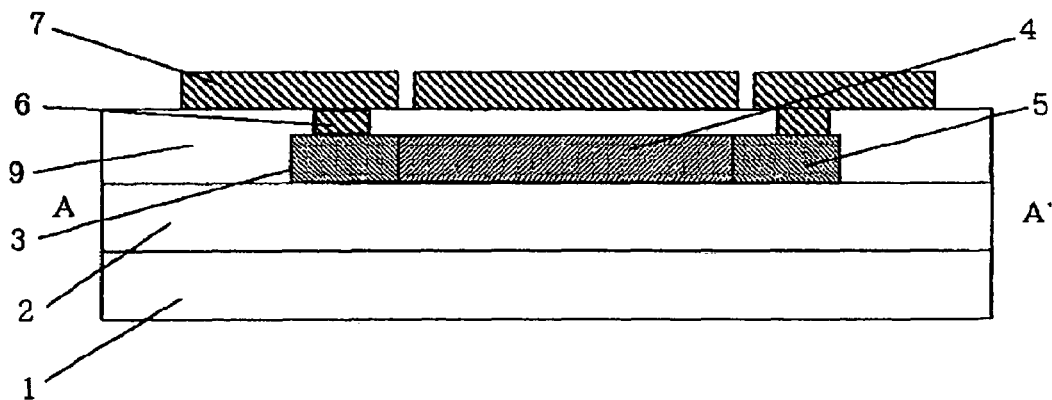
Figure 2A:
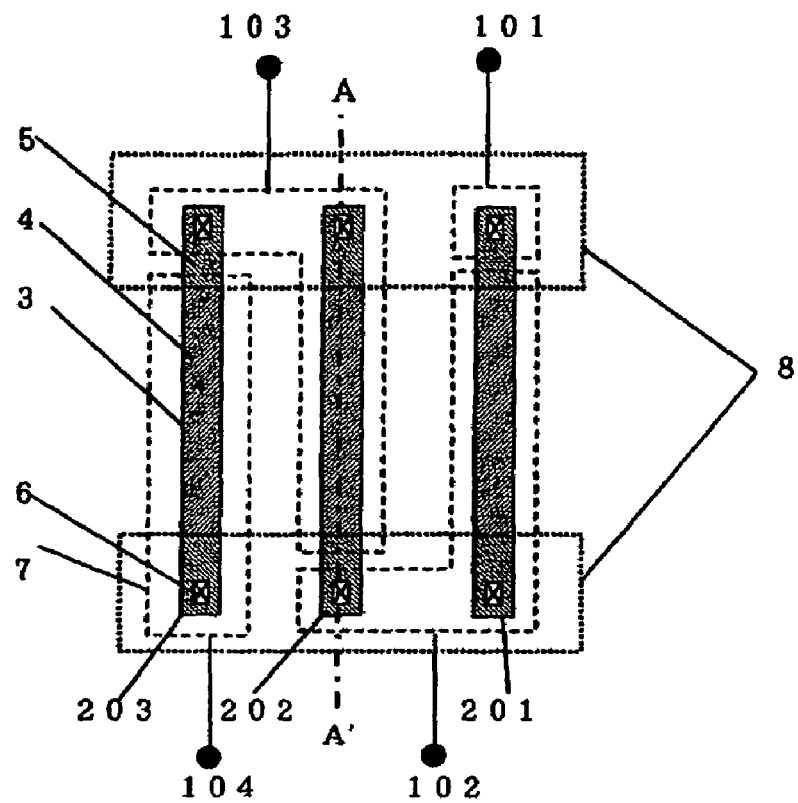
FIG. 2A is a schematic plan view of a conventional polycrystalline silicon resistor circuit.
Figure 2B:
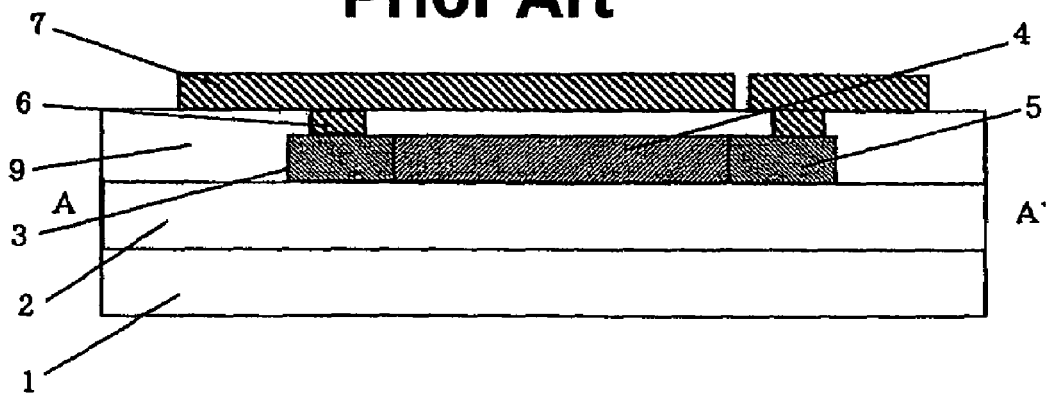
FIG. 2B is a schematic sectional view of a conventional polycrystalline silicon resistor circuit taken along line A-A' in FIG. 2A.
Figure 3:
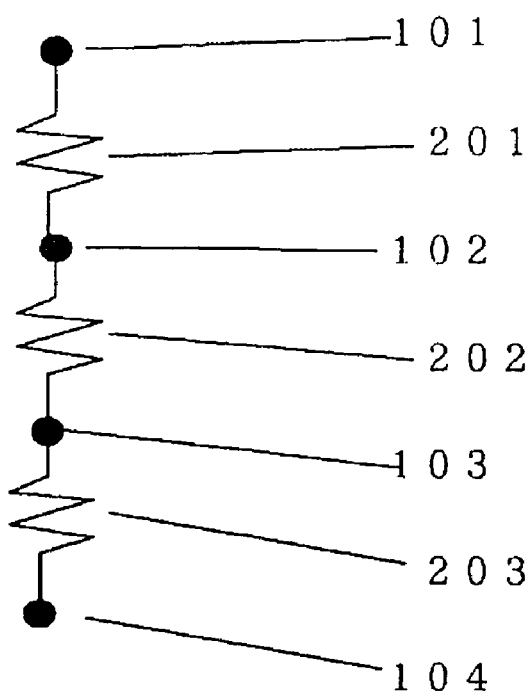
FIG. 3 is a circuit diagram of a resistor circuit.

FIGS. 1A and 1B show an embodiment of the present invention for realizing a resistor circuit shown in FIG. 3. Resistors 1 (201) to 3 (203) are each formed of the polycrystalline silicon film 3 which is formed on the insulating film 2 on the semiconductor substrate 1 and which is composed of the low concentration impurity region 4 and a pattern 8 of the high concentration impurity regions 5 as in the prior art. The potential of the terminal A (101) and the terminal D (104) is taken out respectively through the metal wirings (first metal wirings 7 and second metal wirings 10) via the contact holes 6 formed in the second insulating film 9 and provided on the high concentration impurity regions 5.

However, in the prior art, as regards the metal wiring covering the resistor, there has been adopted the structure in which the metal wiring of one of the terminals covers the resistor connected therewith. However, in the present invention, one metal wiring covers all the resistors included in the resistor circuit, and the metal wiring is connected to a specific terminal in the resistor circuit. Specifically, in the embodiment shown in FIG. 1, the low concentration impurity region and high concentration impurity region in the resistor made of boron or the like having a P-type polarity, and the metal wiring that covers the resistors that constitute the resistor circuit is connected to the terminal D (104) that shows the minimum potential in the resistor circuit. The same effect can be obtained if the metal wiring is connected to the terminal A (101) that shows the maximum potential.

Further, according to the present invention, the length of the high concentration impurity region provided for obtaining the terminal potential of the resistor is changed in each resistor, thereby changing the length of the low concentration impurity region, that is, the length of the resistor. More specifically, for each resistor the length L of the low concentration impurity region 4 is determined by varying the pattern 8 of the high concentration impurity region 5 so that the low concentration impurity regions 4 of the resistors have different lengths from one another, as denoted by L1-L3 in FIG. 1. As regards the degree of the change in length in FIG. 1, the length of each of the low concentration impurity regions 4 is adjusted to be longer from the resistor connected to the minimum potential to the resistor connected to the maximum potential.

With the above-described structure, the respective resistors do not need to be covered with the metal wirings with a larger size than that of the resistor, and thus, the resistors can be arranged with the minimum intervals. As a result, a resistor circuit having a smaller area than that of the conventional resistor circuit can be formed. This effect increases as the number of resistors that constitute the resistor circuit increases.

Since a single metal wiring covers all the resistors that constitute the resistor circuit in the structure of the present invention, the potential between the respective resistor and the metal wiring just above the resistor differs. In the structure as shown in FIG. 1, there is almost no potential difference between the resistor 3 and the metal wiring just above, however, as regards the resistor 1, the potential of the metal wiring just above is considerably lower than that of the resistor 1 itself. In the conventional structure in which the resistor 3 and the resistor 1 have completely the same shapes, the resistor 1 shows a lower resistance due to carrier accumulation caused by the potential of the metal wiring just above. Accordingly the resistors in the resistor circuit become out of balance, which causes an error in designed value of the respective potential output from terminals B (102) and C (103).

In order to avoid such an error, in the present invention, the length of each of the resistors is changed in advance. However, when the length or width of a polycrystalline silicon pattern is changed, a desired patterned shape may not be obtained due to, for example, the difference in a microloading effect at the time of polycrystalline silicon patterning. Further, when resistivity is changed, for example, by varying an impurity amount of the low concentration impurity region, a temperature characteristic varies and an error occurs at high or low temperature even if there is no output potential error at room temperature.

The length of the resistor is hence changed by varying the pattern 8 of the high concentration impurity region in the present invention to cancel the variation in resistance, which arises from an interaction between the metal wiring potential and the resistor potential.

The variation in the resistance, which arises from the interaction between the metal wiring potential and the resistor potential and which comes out by the adoption of the present invention, is uniquely determined by: process parameters such as concentration of the low impurity concentration region of the resistor, thickness of the insulating film between the resistor and the metal wiring, and dielectric constant; and design parameters such as structure of the resistor circuit and its application voltage. More strictly, the variation changes according to grain size of polycrystalline silicon and grain boundary density. Accordingly the length of the high concentration impurity region can be determined, when the applicable process and design information are fixed.

For example, in the case where the low concentration impurity of the polycrystalline silicon resistor is of a P-type and has a concentration of $1.5 \times 10^{19}/cm^3$ and the insulating film between the metal wiring and the resistor is composed of an oxide film and has a thickness of 0.5 μm, when a potential difference of 1 V exists between the metal wiring and the resistor, variation in the polycrystalline silicon resistor is expected to be approximately 0.25% following the voltage polarity. If a voltage of 10 V is applied to the resistor circuit, the resistance of the resistor, which has the maximum potential (about 10 V) in the resistor circuit, should be smaller by 2.5%. For example, in the case where a unit length of a resistor is supposed to be 100 μm, the high concentration impurity region should be set 2.5 μm longer than the resistor on the minimum potential side to attain a length of 102.5 μm. The lengths of intermediate resistors should be changed in accordance with the ratio between the voltage and the resistance value.

In the above example, the potential of the metal wiring covering the polycrystalline silicon resistor is set to be the minimum potential in the resistor circuit for the sake of convenience for description. However, the same effect can be obtained even when connection is established such that the metal wiring potential is set to be the maximum potential.

FIG. 1 shows an example in which the impurity implanted to the polycrystalline silicon resistor is supposed to be P-type, but the present invention can be applied also to the case of N-type. In the N-type case, the layout of the high concentration impurity region in the resistor is inverted. That is, the phenomenon of depletion/accumulation with respect to the relative relationship in voltage is opposite between the P-type and the N-type. Thus, in the case where the potential of the metal wiring covering the resistor is connected to the minimum potential of the resistor circuit as in FIG. 1, the resistor 1 on the maximum potential side is depleted to show high resistance. The high concentration impurity region is consequently set to be longer to shorten the length of the low concentration impurity region to obtain the same effect.

In the above example, the metal wiring covers only the portion above the polycrystalline silicon resistor, and the metal wiring potential is fixed to one of the potentials of the resistor circuit. By the same reason above, the same effect can be obtained with a method in which the potential of the semiconductor substrate under the polycrystalline silicon resistor is fixed by using a diffusion region such as a well and one of the potentials of the resistor circuit is fixed to the potential.

Furthermore, it goes without saying that the same effect can be obtained also by simultaneously fixing the potentials with the use of both the metal wiring on the upper side of the polycrystalline silicon resistor and the diffusion region such as a well on the lower side of it.

What is claimed is:

1. A semiconductor device comprising:
   a semiconductor substrate;
   a first insulating film formed on the semiconductor substrate;
   a plurality of resistors having the same shape and disposed on the first insulating film, each of the resistors being formed of a polycrystalline silicon film having a low concentration impurity region and high concentration impurity regions disposed on opposite sides of the low concentration impurity region, the low concentration impurity regions of the plurality of resistors having different lengths from one another;
   a second insulating film disposed on the plurality of resistors;
   a plurality of contact holes formed on the second insulating film and disposed on the high concentration impurity regions;
   first metal wirings connected to the respective contact holes and connecting the plurality of resistors in series; and
   a second metal wiring connected to one of the resistors located at one end of the plurality of resistors connected in series, the second metal wiring covering the low concentration impurity region of all of the plurality of resistors.

2. A semiconductor device according to claim 1 wherein the length of the low
   concentration impurity region in each of the plurality of resistors is longest at a first end of the plurality of resistors connected in series, shortest at a second end of the plurality of resistors connected in series, and gradually becomes shorter from the first end to the second end.

3. A semiconductor device comprising:
   a semiconductor substrate;
   a first insulating film formed on the semiconductor substrate;
   a plurality of polycrystalline silicon resistors disposed on the first insulating film, each of the polycrystalline silicon resistors having a low concentration impurity region and high concentration impurity regions, the low concentration impurity regions of the polycrystalline silicon resistors having different lengths from one another;
   a second insulating film disposed on the plurality of polycrystalline silicon resistors;
   a plurality of contact holes formed on the second insulating film and disposed on the high concentration impurity regions;
   first metal wirings connected to the respective contact holes and connecting the plurality of polycrystalline silicon resistors in series; and
   a second metal wiring covering the low concentration impurity region of all of the plurality of polycrystalline silicon resistors.

4. A semiconductor device according to claim 3 wherein the length of the low concentration impurity region in each of the polycrystalline silicon resistors is longest at a first end of the polycrystalline silicon resistors connected in series, shortest at a second end of the polycrystalline silicon resistors connected in series, and gradually becomes shorter from the first end to the second end.

5. A semiconductor device comprising:

a semiconductor substrate;

a first insulating film formed on the semiconductor substrate;

a plurality of polycrystalline silicon resistors connected in series and disposed on the first insulating film, the polycrystalline silicon resistors having low concentration impurity regions and a pattern of high concentration impurity regions disposed on opposite sides of the low concentration impurity regions so that the low concentration impurity regions have different lengths from one another;

a second insulating film disposed on the plurality of polycrystalline silicon resistors;

a plurality of contact holes formed on the second insulating film and disposed on the high concentration impurity regions;

first metal wirings connected to the respective contact holes and connecting the plurality of polycrystalline silicon resistors in series; and a second metal wiring covering the low concentration impurity region of all of the plurality of polycrystalline silicon resistors.

6. A semiconductor device according to claim 5 wherein the length of the low concentration impurity region in each of the polycrystalline silicon resistors is longest at a first end of the polycrystalline silicon resistors connected in series, shortest at a second end of the polycrystalline silicon resistors connected in series, and gradually becomes shorter from the first end to the second end.

* * * * *